United States Patent [19]

Deambrosio

[11] E Patent Number: Re. 33,197

[45] Reissued Date of Patent: Apr. 10, 1990

[54] VIBRATOR WAVE SOLDERING

[75] Inventor: Carlos A. Deambrosio, Montreal, Canada

[73] Assignee: Electrover Limited, Ontario, Canada

[21] Appl. No.: 182,479

[22] Filed: Apr. 15, 1988

Related U.S. Patent Documents

Reissue of:

[64] Patent No.: 4,684,056
Issued: Aug. 4, 1987
Appl. No.: 830,962
Filed: Feb. 19, 1986

[30] Foreign Application Priority Data

May 3, 1985 [GB] United Kingdom ..... 8511280

[51] Int. Cl.[4] ..... B23K 31/02

[52] U.S. Cl. ..... 228/180.1; 228/262; 228/37

[58] Field of Search ..... 228/180.1, 37, 260, 228/262, 56.2, 56.1

[56] References Cited

U.S. PATENT DOCUMENTS

| | | | |
|---|---|---|---|
| 3,140,527 | 6/1965 | Tardoskegyi | 228/37 |
| 3,266,136 | 8/1966 | Gutvier | 228/37 |
| 3,277,566 | 10/1966 | Christensen | 29/471.1 |
| 3,303,983 | 2/1967 | Patrick et al. | 228/37 |
| 3,430,332 | 3/1969 | Roczy-Koller | 228/37 |
| 3,536,243 | 10/1970 | Higgins | 228/37 |
| 3,605,244 | 9/1971 | Osborne et al. | 29/471.1 |
| 3,921,888 | 11/1975 | Elliott et al. | 228/180 |
| 3,989,180 | 11/1976 | Tradoskegyi | 228/180.1 |
| 3,990,621 | 11/1976 | Boynton et al. | 228/37 |
| 3,993,236 | 11/1976 | Antonevich | 228/110 |
| 4,139,881 | 2/1979 | Shimizu et al. | 361/400 |
| 4,465,219 | 8/1984 | Kondo | 228/37 |
| 4,540,114 | 9/1985 | Pachschwoll | 228/37 |

FOREIGN PATENT DOCUMENTS

| | | |
|---|---|---|
| 718666 | 9/1965 | Canada . |
| 3277566 | 6/1984 | Fed. Rep. of Germany . |
| 14526 /// | 6/1985 | Japan . |

*Primary Examiner*—Nicholas P. Godici
*Assistant Examiner*—Karen Skillman
*Attorney, Agent, or Firm*—Darby & Darby

[57] ABSTRACT

Wave soldering process and apparatus for the soldering of elements such as, for example, printed circuit assemblies with surface mounted components and the like which yield improved soldering results by promoting the penetration of solder into narrow spaces between components, the filling of small holes in a board, filling crevices, filling corners adjacent to solder masks and all other areas where solder wetting is difficult to achieve with conventional machines. The process provides the steps of moving an element in a predetermined path, forming a solder wave beneath the path so that at least a portion of the element passes through the solder wave, and producing an oscillation in the solder wave during the passage of the element therethrough.

39 Claims, 4 Drawing Sheets

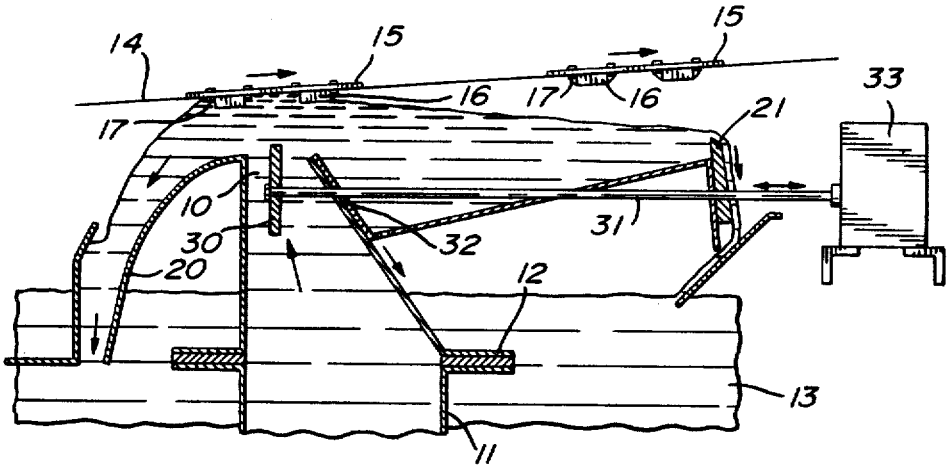
FIG. 1
FIG. 2
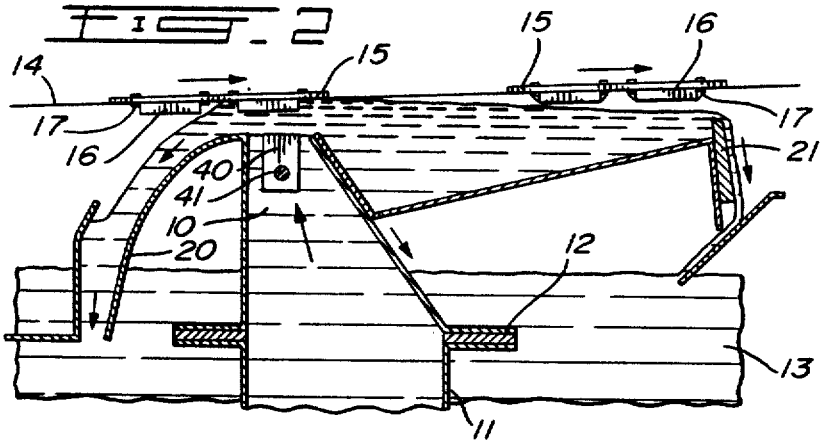

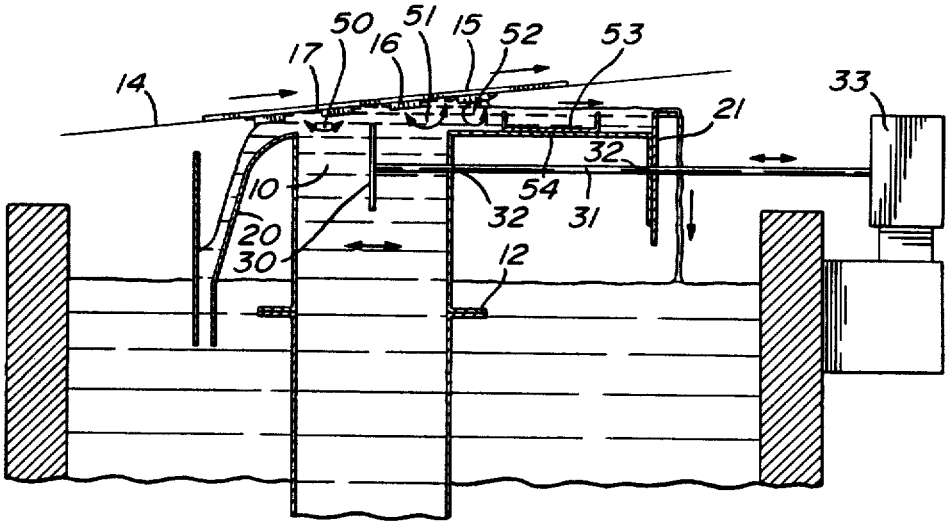
FIG. 4
FIG. 5
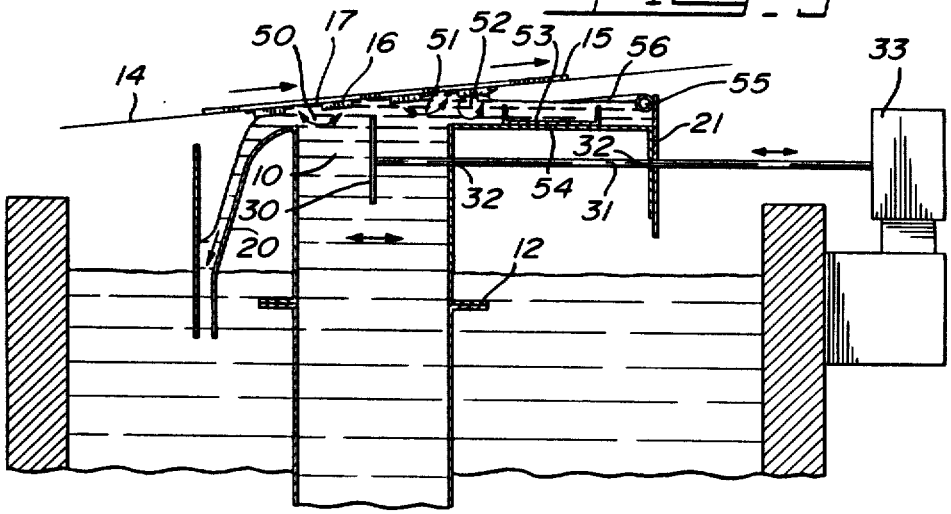

VIBRATOR WAVE SOLDERING

Matter enclosed in heavy brackets [ ] appears in the original patent but forms no part of this reissue specification; matter printed in italics indicates the additions made by reissue.

The present invention relates to wave soldering of printed wiring boards. More specifically, the present invention relates to wave soldering of surface mounted devices or components on printed wiring boards as well as standard components on single sided, double sided and/or multi-layer boards.

New technologies in the electronic component industry have introduced surface mounted devices such as resistors, capacitors, integrated circuits and the like, in the form of chip components. These components are mounted usually with an adhesive to the bottom side of a printed wiring board. These conditions present new problems for existing soldering processes.

The present methods of wave soldering surface mounted devices on printed wiring boards include systems having two solder waves. The first solder wave typically has a narrow turbulent parabolic shape. The narrow wave contacts a small area on the wiring board allowing gases to escape. The gases are generated by flux volatiles and the like, which can inhibit solder wetting. The narrow wave also provides a vertical pressure to force solder into the small [saces] *spaces* and openings between the components to ensure that all circuit pads, components, terminations, contacts, and the like, are wetted with solder.

The second solder wave is typically a solder wave as used in commercially available machines for soldering printed wiring boards with leaded components and the like. The second wave completes the process and provides optimum exit conditions for the printed wiring boards leaving the solder wave to minimize or eliminate excess solder deposits and eliminate bridges between contacts.

The dual solder wave process has proven to be effective for soldering surface mounted devices onto printed wiring boards, but the process suffers from certain disadvantages. One problem is excessive dross (oxide production. Dual wave systems typically produce up to twice as much dross as single wave systems. Another problem is the lack of fine control of a turbulent parabolic solder wave. Best soldering results have been obtained by immersing the printed wiring board as deeply as possible in this wave. However, the turbulence of the wave makes this task difficult and may result in solder flooding onto the top side of the printed wiring boards. A still further problem with the dual solder wave process can occur when particles of dross, particles of carbonized oil or other particles in the solder stream block or partially block the narrow nozzle of the first solder wave. Such a blockage can affect the turbulent flow. It is one purpose of the present invention to provide an apparatus and a process for wave soldering elements such as printed wiring boards with surface mounted devices that overcome the above mentioned problems. It is a further aim of the present invention to provide a controllable vibration or oscillation to a solder wave as opposed to room turbulence. The term vibration and oscillating used throughout the specification and claims refer to frequencies below about 20 kHz.

The present invention provides a process and an apparatus for wave soldering elements such as surface mounted devices on a printed wiring board wherein a solder wave is subjected to an oscillation or vibration during the passage of a printed wiring board therethrough. The oscillations or vibration aids in filling small holes in a board, crevices, corners adjacent to solder masks and all other areas where solder wetting is difficult to achieve with conventional machines. An additional benefit is overcoming problems that occur with thick dry film solder mask. A relatively high frequency oscillation in the solder wave displaces or dislodges gas bubbles that form beneath the boards, allowing the solder to reach all areas in the matrix of components on the printed wiring boards, overcoming the repelling effect of any non-metallized elements such as component bodies, solder masks and the like.

Furthermore the vibrating or oscillating concept of the present invention can be applied to existing types of solder wave machines or wave soldering, either as a permanent installation or a temporary installation for soldering certain difficult to solder elements.

The present invention provides a process for wave soldering an element comprising the steps of: moving the element in a [pre-deterined] *pre-determined* path, forming a solder wave beneath the path so that at least a portion of the element passes through the solder wave, and producing an oscillation in the solder wave during the passage of the element therethrough.

Preferably frequency of the oscillation and/or the amplitude of the oscillation are controlled and at least one vibrating zone is formed in the solder wave. In one embodiment the oscillation occurs in a direction substantially parallel to the path of the element and in another embodiment, the oscillation occurs in a direction substantially perpendicular to the path of the element.

There is also provided in the present invention an apparatus for wave soldering surface mounted devices and the like on a printed wiring board comprising means of forming a solder wave, means for moving the wiring board in a path so that the underside of the wiring board passes through the solder wave, and oscillation means to produce oscillations in the solder wave during the passage of the wiring board therethrough.

In one embodiment the oscillating means comprises at least one vibrating vane in the solder wave, and at least one connector rod connecting the vane to a vibrator means located away from the solder wave. In another embodiment at least one vibrating vane is in the form of a flat strip and extends in the solder wave substantially perpendicular to the path of the wiring board, and the vibratory means oscillates the flat strip in a direction substantially parallel to the path of the wiring board. In a still further embodiment, a plurality of vibrating vanes are joined by a connector rod, and the vibrator means oscillates the vanes in a direction substantially perpendicular to the path of the wiring board. Means to control the frequency and/or amplitude of vibration are preferably provided with a frequency range of about 20 to 400 cycles per second, and an amplitude up to at least about 1.5 mm (0.060 ins.) Furthermore, the position of the vane in the solder wave is preferably adjustable. Means are also provided in one embodiment to optionally feed a surface additive such as oil to the solder wave.

In other embodiments, the solder wave is formed from a discharge nozzle facing upwards positioned above a solder reservoir with a pump means for forming the solder wave from the nozzle. A vibrating vane is in one embodiment positioned in the solder wave and at least two zones of vibration are formed.

In another embodiment at least one adjustable passive element is located in the solder wave downstream from the discharge nozzle at the element exit side, the position of the passive element provides a further zone of vibration to aid in separation of the element such as a wiring board and the like from the solder wave.

At least one liquid surface additive feeding tube may be positioned downstream of the passive element and means are provided to supply liquid surface additive through the feeding tube to the surface of the solder wave.

In drawings which illustrate embodiments of the invention:

FIG. 1 shows a cross section of a solder wave applied to the underside of a wiring board illustrating one embodiment of a vibrating vane;

FIG. 2 shows a cross section of a solder wave illustrating another embodiment of a vibrating vane;

FIG. 4 shows a cross section of a solder wave illustrating yet another embodiment of a vibrating vane;

FIG. 5 shows a cross section of a solder wave illustrating a still further embodiment of a vibrating vane with a liquid surface additive feeding tube;

Figure 3:
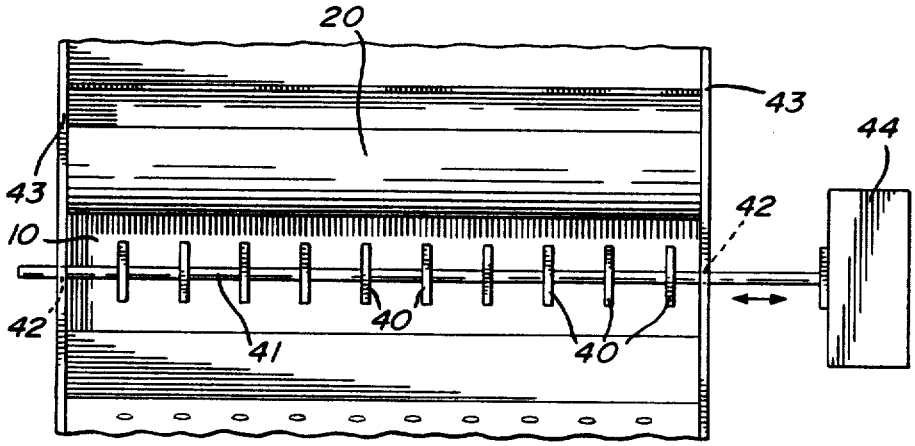
FIG. 3 shows a plane view of the vibrating vane shown in FIG. 2.

Referring now to the drawings, FIGS. 1 and 2 illustrate cross sections through a typical solder wave nozzle 10 such as that shown in Canadian Pat. No. 1,002,391 to Elliott et al. The nozzle 10 is connected to a solder supply conduit 11 by means of a flange 12. Solder enters the nozzle 10 and forms the desired shape of solder wave. The solder flows back into a solder pot 13.

Above the solder pot 13 is a wiring board path 14 along which wiring boards 15 are conveyed. The drawings illustrate a straight inclined path 14, however, the present invention may be applied to solder wave machines with horizontal or curved paths. Furthermore, the elements to be soldered may follow dip type paths in the solder wave such as a reciprocal dip, curved dip or other path. Such a dipping step may be used for timing one or more surfaces. The printed wiring boards 15 have surface mounted devices 16 with pads and contacts 17 to be coated with solder and form soldered connections. The entry side of the nozzle 10 has a guide 20 to provide a downward sloping path for a portion of the solder The exit solder wave flows to a weir plate 21.

FIG. 1 shows a vibrating vane 30 in the form of a flat strip positioned in the nozzle 10 extending along the length of the nozzle. The vane 30 has a top edge shown to be substantially the same height as the top edge of the nozzle 10. Alternatively, the top edge of the vane 30 may be below the top edge of the nozzle or higher than the top edge of the nozzle provided it is not so high as to interfere with passage of the assembly being soldered.

A connecting rod 31 which in some nozzles may be two or more rods, pass through an aperture 32 in the exit side of the nozzle 10 to support the vane 30. The rods 31 connect to a vibrator 33 positioned away from the solder nozzle 10 above the solder pot 13. The exact position of the vibrator 33 as well as the rods 31 to the vane or vanes 30 may be varied. The vibrator may be located above or below the solder wave and is supported to ensure that vibration is transmitted to the vane 30. The frequency and/or amplitude of vibration is controllable by the vibrator 33. It is preferred to vibrate the solder wave a sufficient amount so that gas bubbles that form beneath the wiring board 15 are displaced or dislodged, allowing solder to reach component termination and other hard to reach areas to be soldered. Large gas bubbles may be broken into smaller ones and all the bubbles are continuously shifted allowing the solder to reach all areas. The vibration is also sufficient to cause the molten solder to be forced up on either side of the surface mounted devices overcoming the repelling effect of the non-metallized component bodies. The solder then wets the metallic areas to be soldered, such as component terminations, pads etcetera or forms solder joints as required. The vibrating frequency together with the amplitude of vibration is adjustable to suit different types of wiring boards.

FIGS. 2 and 3 illustrate another embodiment wherein a series of short individual vanes 40 are positioned perpendicular to the length of the nozzle 10 and have a connecting rod 41 connecting all the vanes 40 together. Wherein one rod 41 is shown, it would be apparent that two or more rods may be used if necessary. The rod 41 is supported at apertures 42 in the end plates 43 of the nozzle 10 and is connected to a vibrator 44 such that vibration occurs in a different plane to that shown in FIG. 1. FIG. 1 illustrates that vibrations or oscillations occur substantially parallel with the travel of the wiring board path 14, and FIGS. 2 and 3 show that vibrations or oscillations occur substantially perpendicular to the travel of the wiring board path 14. The position of the vanes 40 in the nozzle 10 may be raised or lowered and the number of vanes 40 may depend on the particular type of wave soldering machine and the particular type of printed wiring boards being soldered. The size, shape, quantity and angle of vanes can be varied as required. The vibrations or oscillations may be applied at any angle between the two directions shown in FIGS. 1 and 2.

In one embodiment shown in FIG. 4 the vibrating vane 30 is connected to the vibrator 33 by one or more connecting rods 21. As shown in this figure, the top edge of the vibrating vane 30 protrudes slightly above the to edge of the nozzle 10. The top edge of the vane 30 must not interfere with the surface mounted devices On the wiring board 15. The position of the vibrating vane 30 is adjustable for optimizing the vibrating characteristics and soldering results. The wiring board path in FIG. 4 has a slope of 6° upwards in the direction of travel. The slope angle of the path may vary from about 0° to 10° dependent upon the type of solder machine. Furthermore, curved paths or dip type paths may be provided through the solder wave.

In the embodiment shown in FIGS. 4 and 5, two solder wave vibrating zones 50 and 51 are shown, one on each side of the vibrating vane 30 under the wiring board 15. These zones 50 and 51 allow the solder to reach all the areas requiring solder wetting. A further zone or zones of vibration 52 is formed by using a passive element 53 on the exit side of the nozzle 10 before the weir plate 21. The passive element 53 may be located at the most suitable position avoiding the components on the printed wiring board 15, and the further vibration zone 52 preferably occurs between the nozzle and the weir. In one embodiment the further vibration zone occurs at the point or close to the point of separation of the board 15 from the solder wave. This further vibration applied to the board and solder wave in the further zone 52 reduces the possibilities of bridges occurring between contacts or pads. The passive element 53 also has a damping effect on the solder located between the weir 21 and the passive element 53. The U-shaped passive element 53 shown in the drawing may be located at different positions in the exit trough 54 to vary the position of the further zone 52.

Figure 6:
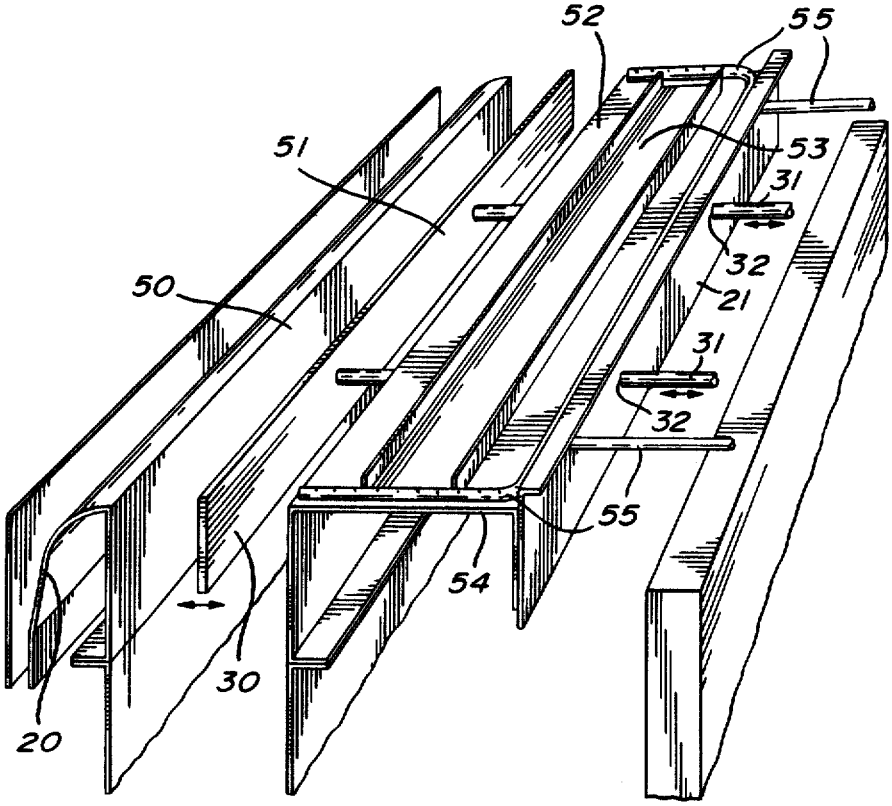
FIG. 6 shows a side isometric view of the vibrating vane shown in FIG. 5.
Figure 3A:
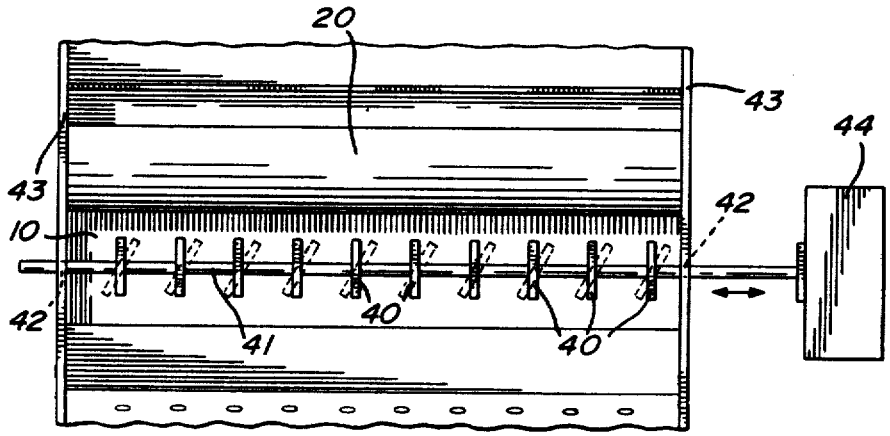
*FIG. 3A is the device of FIG. 3 showing the vanes in an adjusted position.*
Figure 6A:
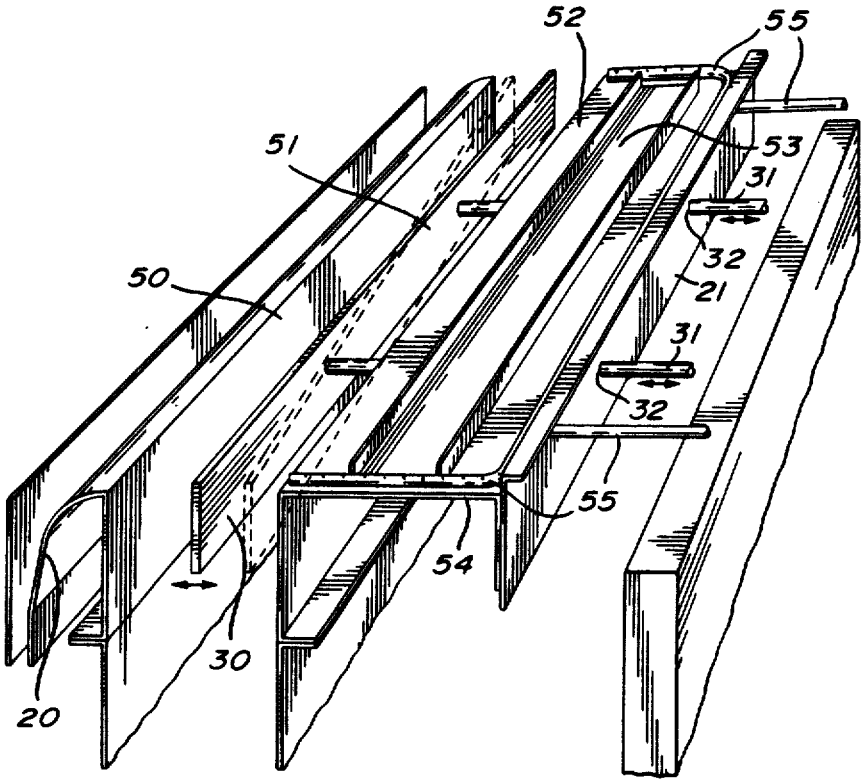
*FIG. 6A is the device of FIG. 6 showing the vane in an adjusted position.*

FIGS. 5 and 6 show a modification to the apparatus shown in FIG. 4 wherein a feeding tube 55 for a surface additive such as oil, is positioned adjacent to the weir 21 which allows an oil reservoir 56 to be formed between the tube 55 and the surface of the solder. A thin coating of oil or other surface additive is created on the surface of the solder wave that reduces surface tension and at the same time reduces dross formation on the wave surface.

Whereas several embodiments of vanes have been shown herein, it will be understood that the vanes need not necessarily be located in the nozzle itself, but may be positioned in the solder stream between the nozzle exit and the weir 21. The vanes may be positioned on the input side of the solder wave indicated as zone 50 in FIGS. 4 and 5. There are no random parameters in the vibratory wave because the frequency of oscillation and amplitude of oscillation are precisely controlled. The shape or form of the vanes may be varied in order to apply vibration at a suitable location in the solder wave. The suitable location being one which displaces or dislodges gas bubbles from underneath the wiring board, and allows solder to reach all areas to be soldered. In one embodiment the vibrator can produce a frequency in the range of 20 to 400 cycles per second and can also vary the amplitude of vibration up to at least about 1.5 mm (0.060 inches). Higher frequencies can also be used. By utilizing the vibrating device with a streamline solder wave, it has been found that the quality of soldering on wiring boards is at least as good as the two solder wave type of solder machine.

Various changes may be made to the embodiments shown herein without departing from the scope of the present invention which is limited only by the following claims.

The embodiment of an invention in which an exclusive property or privilege is claimed are defined as follows:

1. Process for wave soldering a prefluxed element comprising the steps of:

moving the element in a predetermined path;

forming a solder wave having a predetermined configuration beneath the path so that at least a portion of the element passes through the solder wave; and producing an oscillation in the solder wave in the range of about 20 to 400 Hz during the passage of the element therethrough, the oscillation not substantially changing the predetermined configuration of the solder wave.

2. Process for wave soldering surface mounted devices to a prefluxed printed wiring board or assembly comprising the steps of:

moving the wiring board in a predetermined path;

forming a solder wave having a predetermined configuration beneath the path, so that the underside of the wiring board passes through the solder wave; and producing an oscillation in the solder wave in the range of a bout 20 to 400 Hz during the passage of the wiring board therethrough, the oscillation not substantially changing the predetermined configuration of the solder wave.

3. The process according to claim 1 wherein frequency of the oscillation is controllable.

4. The process according to claim 1 wherein amplitude of the oscillation is controllable.

5. The process according to claim 1 wherein at least one vibrating zone is formed in the solder wave.

6. The process according to claim 1 wherein a plurality of vibrating zones are formed in the solder wave.

7. The process according to claim 1 wherein the oscillation occurs in a direction substantially parallel to the path of the element.

8. The process according to claim 1 wherein the oscillation occurs in a direction substantially perpendicular to the path of the element.

9. The process according to claim 1 including application of a surface additive to the surface of the solder wave.

10. An apparatus for wave soldering a prefluxed element comprising:

means for forming a solder wave having a predetermined configuration;

means for moving the element in a path so that at least a portion of the element passes through the solder wave, and oscillating means to produce oscillations in the solder wave in the range of about 20 to 400 Hz during the passage of the element therethrough, the oscillations not substantially changing the predetermined configuration of the solder wave.

11. An apparatus for wave soldering surface mounted devices to a prefluxed printed wiring board or assembly comprising:

means for forming a solder wave having a predetermined configuration;

means for moving the wiring board in a path so the underside of the wiring board passes through the solder wave; and oscillating means to produce oscillations in the solder wave in the range of about 20 to 400 Hz during the passage of the wiring borad therethrough, the oscillations not substantially changing the predeteined configuration of the solder wave.

12. The apparatus according to claim 10 wherein the oscillating means comprises at least one vibrating vane in the solder wave, and at least one connector rod connecting the vane to a vibrator means located away from the solder wave.

13. The apparatus according to claim 12 wherein at least one vibrating vane in the form of a flat strip extends in the solder wave substantially perpendicular to the path of the element, and the vibrator means oscillates the flat strip in a direction substantially parallel to the path of the element.

14. The apparatus according to claim 12 wherein a plurality of vibrating vanes are joined by a connector rod, and the vibrator means oscillates the vanes in a direction substantially perpendicular to the path of the element.

15. The apparatus according to claim 11 wherein the ocillating means includes a vibrator means and controllable means for frequency of vibration from the vibrator means.

16. The apparatus according to claim 15 wherein the frequency can be varied in the range of about 20 to 400 cycles per second.

17. The apparatus according to claim 11 wherein the oscillating means includes a vibrator means and controllable means for amlitude of vibration from the vibrator means.

18. The apparatus according to claim 17 wherein the amplitude is controlled up to at least about 1.5 mm (0.060 ins.)

19. The apparatus according to claim 12 wherein the position of at least one vibrating vane in the solder wave is adjustable.

20. The apparatus according to claim 10 including means to feed a surface additive to the solder wave.

21. An apparatus for wave soldering surface mounted devices on a *prefluxed* printed wiring board comprising:

a reservoir adapted to contain molten solder;

a discharge nozzle facing upwards positioned above the reservoir;

pump means for forming a solder wave *having a predetermined configuration* from the nozzle;

means for moving the wiring board in a path so the underside of the wiring board passes through the solder wave; and oscillating means to produce oscillations in the solder wave *in the range of about 20 to 400 Hz* during the passage of the wiring board therethrough, *the oscillations not substantially changing the predetermined configuration of the solder wave.*

22. The apparatus according to claim 21 wherein the oscillating means comprises at least one vibrating vane in the form of a flat strip extending in the discharge nozzle substantially perpendicular to the path of the wiring board, at least one connector rod connecting the vane to a vibrator means, the connecting rod extending in a direction substantially parallel with the path of the wiring board, and the vibrator means oscillating the vane in a direction substantially parallel to the path of the wiring board.

23. The apparatus acording to claim 22 wherein at least two zones of vibration are formed in the solder wave, one zone on each side of the vane.

24. The apparatus according to claim 23 wherein at least one passive element located in the solder wave downstream from the discharge nozzle at the wiring board exit side, position of the passive element providing a further zone of vibration to aid in separation of the wiring board from the solder wave.

25. The apparatus according to claim 24 including at least one liquid surface additive feeding tube positioned downstream of the passive element, and means to supply liquid surface additive through the feeding tube to the surface of the solder wave.

26. The process according to claim 2 wherein frequency of the oscillation is controllable.

27. The process according to claim 2 wherein amplitude of the oscillation is contlrollable.

28. The process according to claim 2 wherein at least one vibrating zone is formed in the solder wave.

29. The process according to claim 2 wherein a plurality of vibrating zones are formed in the solder wave.

30. The process according to claim 2 wherein the oscillation occurs in a direction substantially parallel to the path of the element.

31. The process according to claim 2 wherein the oscillation occurs in a direction substantially perpendicular to the path of the element.

32. The process according to claim 2 including application of a surface additive to the surface of the solder wave.

33. The apparatus according to claim 11 including means to feed a surface additive to the solder wave.

34. An apparatus for applying solder to prefluxed exposed metallic surfaces and prefluxed protruding metallic surfaces on one face of a circuit board or the like comprising:

a reservoir adapted to contain solder at a predetermined level;

a discharge nozzle facing upwards positioned above the solder level in the reservoir and having a circuit board entry side and a circuit board exit side;

means for forming a solder wave having a predetermined configuration from the nozzle, the wave contacting the lower face of the circuit board and being higher than any protruding metallic surfaces;

an upward sloping circuit board path above the reservoir passing over the nozzle;

means for moving a circuit board up the path at a predetermined speed from the entry side to the exit side of the nozzle;

the nozzle adapted to permit a greater volumetric portion of the solder wave to flow downwards at the entry side, the entry side of the nozzle having a contoured downward sloping guide adapted to return the solder to the reservoir in a smooth flow;

the exit side of the nozzle having a substantially rectangular tray attached thereto with an adjustable weir at the edge of the tray parallel to the exit side of the nozzle, the shape of the tray together with the weir adapted to reduce feedback of flow disturbances on the solder wave, and guide the remaining volumetric portion of the solder wave in a smooth horizontal or downward sloping stream in substantially the same direction at approximately the same speed as the circuit board moving up the path, and oscillating means to produce oscillation in the solder wave in the range of about 20 to 400 Hz during the passage of the circuit board therethrough, the oscillations not substantially changing the predetermined configuration of the solder wave.

35. The apparatus according to claim 34 wherein a solder receiving section is provided at the circuit board entry side between the nozzle and the solder level of the reservoir, the section having an adjustable guide means for varying the cross sectional area of the section between the adjustable guide means and the contoured downward sloping guide.

36. The apparatus according to claim 34 wherein the discharge nozzle has a vertical wall on the circuit board entry side and an inward sloping wall at the exit side.

37. The apparatus according to claim 34 wherein the adjustable weir at the edge of the tray parallel to the exit side of the nozzle has an inward slope towards the discharge nozzle of a maximum of 15° to the vertical.

38. The apparatus according to claim 34 including a deflector plate mounted beneath the adjustable weir adapted to guide solder to the reservoir.

39. The apparatus according to claim 34 including at least one drain hole in the rectangular tray adjacent the nozzle.

* * * * *

UNITED STATES PATENT AND TRADEMARK OFFICE

CERTIFICATE OF CORRECTION

PATENT NO. : Re. 33,197

DATED : April 10, 1990

INVENTOR(S) : Carlos A. Deambrosio

It is certified that error appears in the above-identified patent and that said Letters Patent is hereby corrected as shown below:

On the title page item [54] and col. 1, line 1.
In the title: delete "VIBRATOR" and substitute therefor --VIBRATORY--.

After "Assignee"; delete "Electrover" and substitute therefor --Electrovert--.

Under "Foreign Application Priority Data:" add -- Nov. 8, 1985 [CA] Canada ...494984--.

After "3,989,180 11/1976": delete "Tradoskegyi" and substitute therefor --Tardoskegyi--.

Before "6/1985 Japan": delete "14526 ///" and substitute therefor--145266--.

UNITED STATES PATENT AND TRADEMARK OFFICE

CERTIFICATE OF CORRECTION

PATENT NO. : Re. 33,197

DATED : April 10, 1990

INVENTOR(S) : Carlos A. Deambrosio

It is certified that error appears in the above-identified patent and that said Letters Patent is hereby corrected as shown below:

In column 1, line 46: after "(oxide", add --)--.
In column 3, line 22: delete "plane" and substitute therefor --plan--.
In column 3, line 50: delete "timing" and substitute therefor --tinning--.
In column 3, line 56: add a period (.) after "solder"
In column 4, line 46: delete "one" and substitute therefor --the--.
In column 4, line 50: delete "to" and substitute therefor --top--.
In column 4, line 52: delete "On" and substitute therefor --on--.
In column 6, line 4 : delete "a bout" and substitute therefor --about--.
In column 6, line 50: delete "predeteined" and substitute therefor --predetermined--.
In column 7, line 8: delete "amlitute" and substitute therefor --amplitute--.
In column 7, line 61: delete "contlrollable" and substitute therefor --controllable--.

Signed and Sealed this

Seventh Day of July, 1992

*Attest:*

DOUGLAS B. COMER

*Attesting Officer*

*Acting Commissioner of Patents and Trademarks*